US012810921B2

(12) United States Patent
Vo et al.

(10) Patent No.: US 12,810,921 B2
(45) Date of Patent: Nov. 24, 2026

(54) NEGATIVE PULL-DOWN VOLTAGE IN A SENSE AMPLIFIER

(71) Applicant: Micron Technology, Inc., Boise, ID (US)

(72) Inventors: Huy T. Vo, Boise, ID (US); Charles L. Ingalls, Meridian, ID (US); Shizhong Mei, Boise, ID (US); Luoqi Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 18/494,463

(22) Filed: Oct. 25, 2023

(65) Prior Publication Data

US 2024/0203482 A1 Jun. 20, 2024

Related U.S. Application Data

(60) Provisional application No. 63/433,526, filed on Dec. 19, 2022.

(51) Int. Cl.
*G11C 11/4091* (2006.01)
*G11C 11/4074* (2006.01)

(52) U.S. Cl.
CPC ...... *G11C 11/4091* (2013.01); *G11C 11/4074* (2013.01)

(58) Field of Classification Search
CPC ............ G11C 11/4091; G11C 11/4074; G11C 11/4094
See application file for complete search history.

(56) References Cited

U.S. PATENT DOCUMENTS

| | | | | |
|---|---|---|---|---|
| 5,970,007 A * | 10/1999 | Shiratake | G11C 7/06 | 365/207 |
| 6,292,417 B1 * | 9/2001 | Seyyedy | G11C 7/12 | 365/207 |
| 10,522,211 B2 * | 12/2019 | Hush | G11C 11/4091 | |
| 2006/0233038 A1 * | 10/2006 | Kang | G11C 11/4094 | 365/230.03 |
| 2007/0268764 A1 * | 11/2007 | Kim | G11C 7/08 | 365/205 |
| 2013/0286716 A1 * | 10/2013 | Rountree | G11C 11/418 | 365/230.01 |
| 2020/0090709 A1 * | 3/2020 | El-Mansouri | G11C 7/067 | |
| 2023/0395130 A1 * | 12/2023 | Vo | G11C 11/4091 | |

OTHER PUBLICATIONS

U.S. Appl. No. 17/829,737, filed Jun. 1, 2022, Huy T. Vo.

* cited by examiner

*Primary Examiner* — Khamdan N. Alrobaie
(74) *Attorney, Agent, or Firm* — Fletcher Yoder, P.C.

(57) ABSTRACT

A memory device may include multiple memory cells configured to store data. The memory device may also include multiple digit lines that carry data to and from a respective memory cell. The memory device may include multiple sense amplifiers each selectively coupled to respective digit lines and including first and second transistors and first and second gut nodes coupled to the first and second transistors, respectively. Each sense amplifier may amplify a differential voltage between the first and second gut nodes by charging the first gut node and discharging the second gut node based on respective charges the digit lines, where a gain of the amplification is based on a negative voltage supplied to the sense amplifier and/or negative digit line write back operations.

20 Claims, 12 Drawing Sheets

NEGATIVE PULL-DOWN VOLTAGE IN A SENSE AMPLIFIER

CROSS-REFERENCE TO RELATED APPLICATIONS

This application claims priority to U.S. Provisional Application No. 63/433,526, filed Dec. 19, 2022, entitled "NEGATIVE PULL-DOWN VOLTAGE IN A SENSE AMPLIFIER," the disclosure of which is incorporated by reference in its entirety for all purposes.

BACKGROUND

Field of the Present Disclosure

Embodiments of the present disclosure relate generally to memory devices. More specifically, embodiments of the present disclosure relate to monitoring operations of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The memory devices utilize sense amplifiers during read operations. Specifically, the read circuitry of the memory device uses the sense amplifiers to receive low voltage (e.g., low differential) signals and amplify relatively small voltage differences to enable the memory device to interpret the data properly. However, some sense amplifiers may consume excess resources (e.g., power and/or area). Furthermore, some sense amplifiers may insufficiently amplify or amplify the low voltages too slowly.

Embodiments of the present disclosure may be directed to one or more of the problems set forth above.

DETAILED DESCRIPTION

Figure 1:
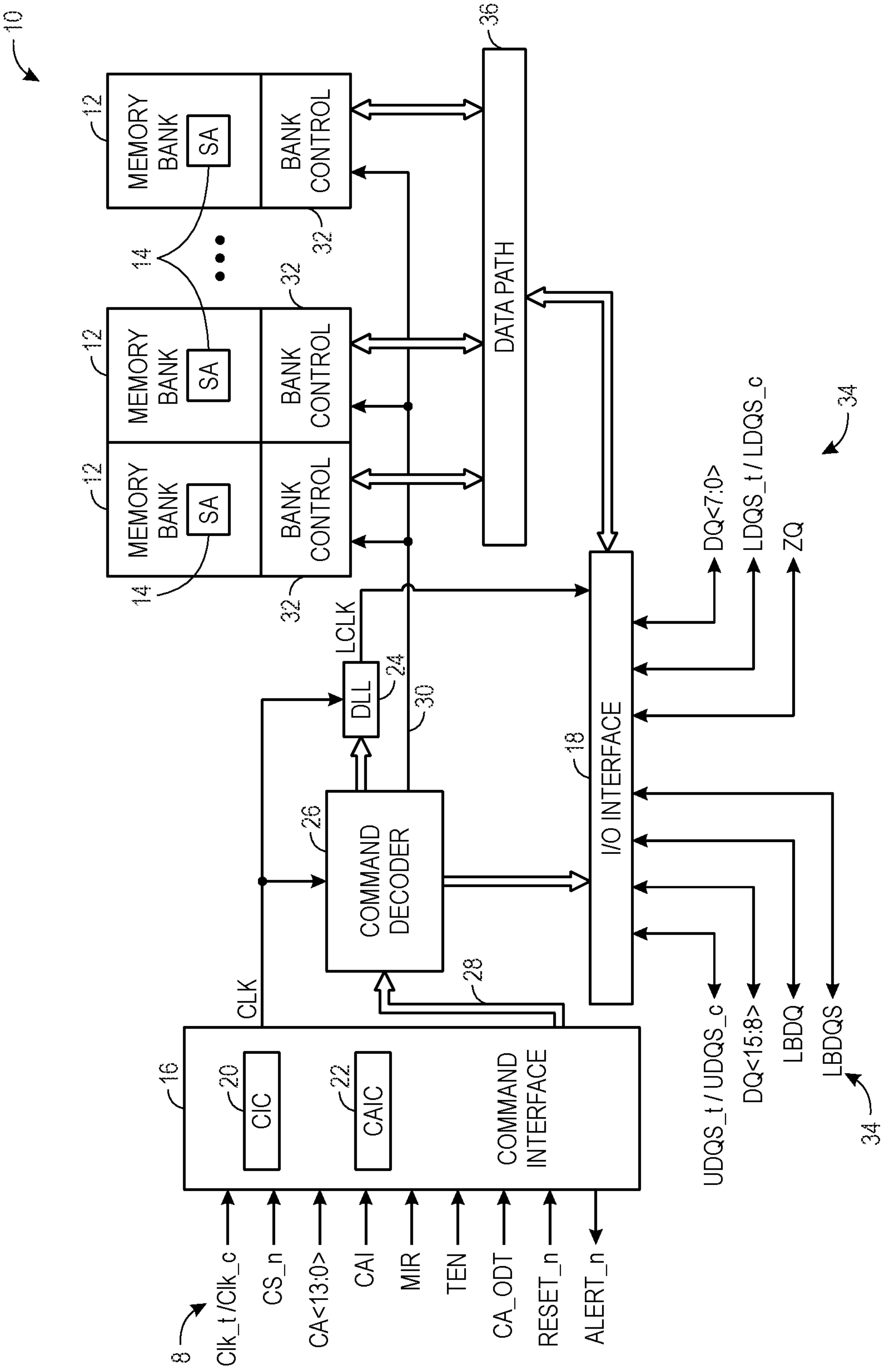
FIG. 1 is a simplified block diagram illustrating certain features of a memory device have sense amplifiers, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, a memory device uses sense amplifiers to receive low voltage (e.g., low differential) signals and to amplify relatively small voltage differences to enable the memory device to interpret the data properly. However, some sense amplifiers may suffer from output drive degradation as designs have been modified over time (e.g., reduced in size to meet array efficiency performance targets).

Indeed, as memories shrink, cell capacitance decreases due to an associated memory cell area decreasing and methods may have increasingly relied on both n-channel and p-channel compensation. A sense amplifier that uses a combined n-channel and p-channel compensation may experience several disadvantages. For example, digit line capacitance may increase and sense amplifier circuitry may decrease in footprint. As sense amplifiers decrease in size, differential voltages on the digit lines may reduce, where the differential voltages may be used to amplify inputs to the sense amplifier. Sense amplifier mis-match and/or the reduction of the differential voltages may reduce an overall read window used during a sensing operation. Furthermore, n-channel and p-channel compensation circuits may be more sensitive to overcompensation from unintentional timing variations and some generations of memory devices may be capped at how great of a high reference voltage may be used. Thus, it may be desired to increase a drive strength of a sense amplifier without also increasing footprint, which may be achievable through an n-channel-centric compensation scheme.

Keeping the foregoing in mind, negative source voltage pre-sense and negative voltage write back systems and methods are described herein that utilize n-channel compensation via the sense amplifier as opposed to a combination of n-channel and p-channel compensation. The p-channel cross-coupled circuitry of the sense amplifier may become a high reference voltage placeholder as opposed to an active portion of the compensation. Due to this, the n-channel-centric threshold voltage compensation (VtC) may result in a voltage closer to a threshold voltage of the sense amplifier, which decreases a gain of the sense amplifier used to amplify sensed signals. Thus, a low reference voltage may be lowered to increase the drive capacity of the sense amplifier to preserve a desired gain of the sense amplifier (e.g., increase the decreased gain).

To elaborate, during the associated negative source voltage pre-sense and negative voltage write back operations, a threshold voltage compensation (VtC) operation may involve reducing a digit line voltage level, which may increase the percentage of VtC compensation (e.g., increase a percent able to be compensated). However, the lower EQ digit line voltage may cause n-channel sense amplifier output drive degradation. To reduce this degradation, a negative source voltage may be pulsed during a presense operation to keep a gate-source terminal voltage (Vgs) of the sense amplifier suitably above a threshold level. At the start of the precharge cycle, the presense n-channel may turn on to bring a digit line or a reference digit line to an adjustable negative voltage level (e.g., from 0 volts (V)). In turn, this may provide a negative voltage level to the cell capacitance before the word lines turn off. Thus, by modifying sense amplifier systems and methods to enable pulsing the negative source voltage to keep the Vgs of the sense amplifier above a threshold level, the differential voltage used by the sense amplifier may be expanded to cause a suitable driving amplification. By doing so, a driver operation of the sense amplifier may increase without increasing a high reference voltage used to amplify signals.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 32 include sense amplifiers 14. As previously noted, sense amplifiers 14 are used by the memory device 10 during read operations. Specifically, read circuitry of the memory device 10 utilizes the sense amplifiers 14 to receive low voltage (e.g., low differential) signals from the memory cells of the memory banks 12 and amplifies the small voltage differences to enable the memory device 10 to interpret the data properly.

The memory device 10 may include a command interface 16 and an input/output (I/O) interface 18. The command interface 16 is configured to provide a number of signals (e.g., signals 8) from an external (e.g., host) device (not shown), such as a processor or controller. The processor or controller may provide various signals 8 to the memory device 10 to facilitate the transmission and receipt of data to be written to or read from the memory device 10.

As will be appreciated, the command interface 16 may include a number of circuits, such as a clock input circuit 20 and a command address input circuit 22, for instance, to ensure proper handling of the signals 8. The command interface 16 may receive one or more clock signals from an external device. Generally, double data rate (DDR) memory utilizes a differential pair of system clock signals, the true clock signal Clk_t and the complementary or bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 20 receives the true clock signal Clk_t and the bar clock signal Clk_c and generates an internal clock signal CLK. The internal clock signal CLK is supplied to an internal clock generator, such as a delay locked loop (DLL) circuit 24. The DLL circuit 24 generates a phase controlled internal clock signal LCLK based on the received internal clock signal CLK. The phase controlled internal clock signal LCLK is supplied to the I/O interface 18, for instance, and is used as a timing signal for determining an output timing of read data. In some embodiments, the clock input circuit 20 may include circuitry that splits the clock signal into multiple (e.g., 4) phases. The clock input circuit 20 may also include phase detection circuitry to detect which phase receives a first pulse when sets of pulses occur too frequently to enable the clock input circuit 20 to reset between sets of pulses.

The internal clock signal(s)/phases CLK may also be provided to various other components within the memory device 10 and may be used to generate various additional internal clock signals. For instance, the internal clock signal CLK may be provided to a command decoder 26. The command decoder 26 may receive command signals from a command bus 28 and may decode the command signals to provide various internal commands. For instance, the command decoder 26 may provide command signals to the DLL circuit 24 to coordinate generation of the phase controlled internal clock signal LCLK. The phase controlled internal clock signal LCLK may be used to clock data through the I/O interface 18, for instance.

Further, the command decoder 26 may decode commands, such as read commands, write commands, mode-register set commands, activate commands, or the like, and provide access to a particular memory bank 12 corresponding to the command, via a bus path 30. As will be appreciated, the memory device 10 may include various other decoders, such as row decoders and column decoders, to facilitate access to the memory banks 12. In one embodiment, each memory bank 12 includes the bank control block 32 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 16 using the clock signals (Clk_t and Clk_c). The command interface may include a command address input circuit 22, which is configured to receive and transmit the commands to provide access to the memory banks 12, through the command decoder 26, for instance. In addition, the command interface 16 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 16 may be configured to receive a number of other command signals. For instance, a command/address on die termination (CA_ODT) signal may be provided to facilitate proper impedance matching within the memory device 10. A reset command (RESET_n) may be used to reset the command interface 16, status registers, state machines and the like, during power-up for instance. The command interface 16 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 16 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 34 through the I/O interface 18. More specifically, the data may be sent to or retrieved from the memory banks 12 over datapath 36, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 18. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the I/O interface 18. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the I/O interface 18. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a double data rate type 4 DRAM (DDR4), a ferroelectric RAM device, or a combination of different types of memory devices).

Figure 2:
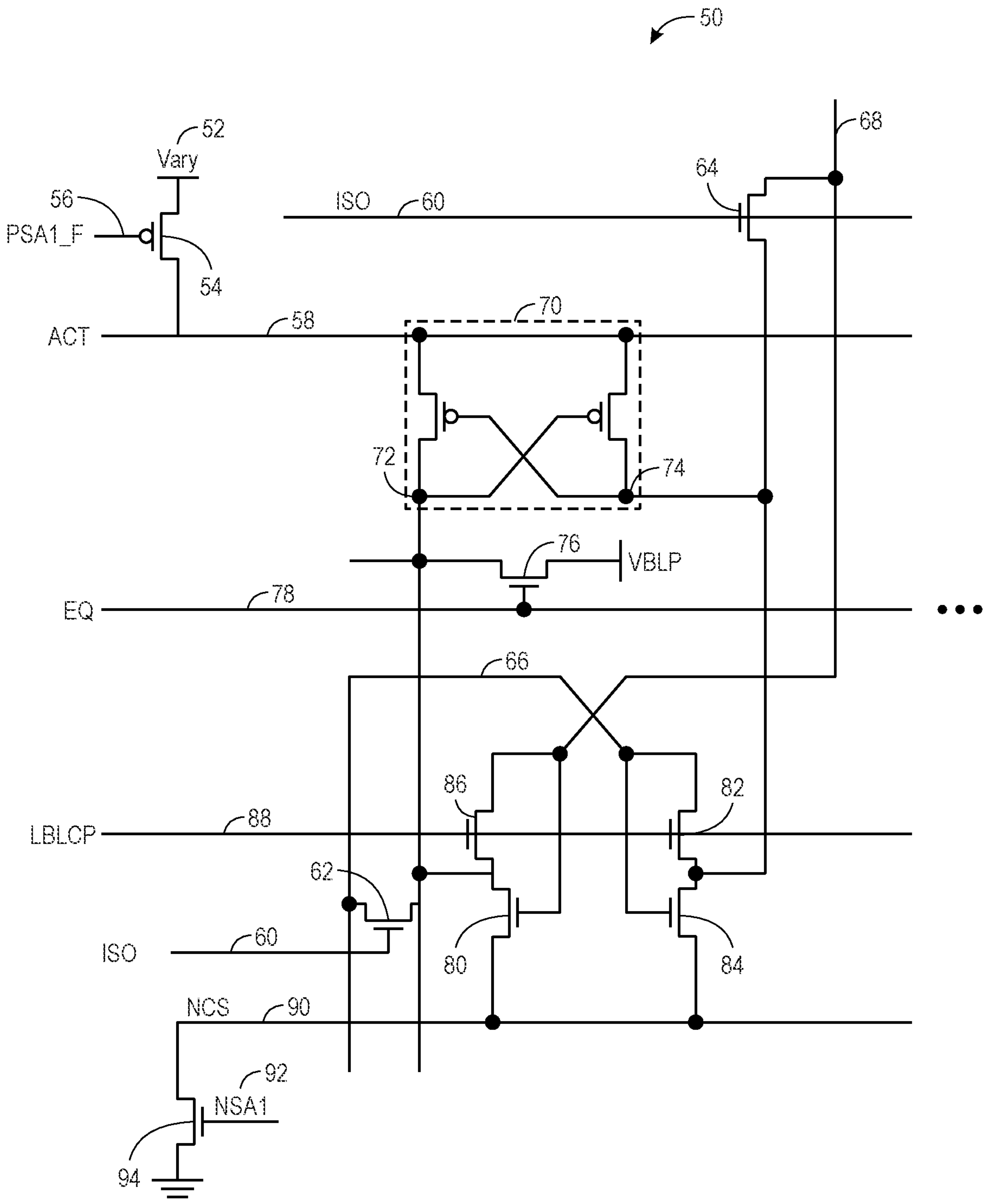
FIG. 2 is a circuit diagram of an example sense amplifier of the sense amplifiers of FIG. 1 that uses n-channel and p-channel compensation, according to an embodiment of the present disclosure.

FIG. 2 is a circuit diagram of a sense amplifier 50 that may be implemented as an embodiment of the sense amplifiers 14 of FIG. 1. Although only a single sense amplifier 50 is shown, multiple sense amplifiers 14 are included in the memory device 10 that may share at least some control signals and/or supply voltages.

As illustrated, the sense amplifier 50 receives an array voltage (VARY) 52. The sense amplifier 50 also includes transistor 54 that receives a control signal PSA1_F 56 at the respective gates of the transistor 54 to control generation of a p-channel activate signal PCS (ACT) 58 as a local voltage. The PCS (ACT) 58 activates the sense amplifier 50 by providing an operating voltage to the sense amplifier 50.

The sense amplifier 50 also receives an isolation signal (ISO) 60 via isolating transistors (transistor 62, transistor 64). The sense amplifier 50 includes transistors 62 and 64 that couple and/or decouple internal circuitry of the sense amplifier 50 from respective digit lines 66 and 68 based on the ISO 60. The digit line 66 may be indicative of the data in the memory cell as a “bit line true” signal (BLT) while the digit line 68 may be opposite as a complementary “bit line bar/false” signal (BLB). Thus, the digit lines 66 and 68 may be complementary pairs and there may be multiple pairs of digit lines associated with the memory device 10. Each digit line 66, 68, such as each digit line 66, 68 of each of the multiple pairs of digit lines associated with the memory device 10, may be coupled to respective memory cells of the memory device 10.

The sense amplifier 50 also includes a cross-coupled p-channel metal oxide semiconductor device (CCP) 70 (e.g., cross-coupled PMOS transistors coupled to a supply voltage). Gut nodes 72 and 74 are each coupled to a first terminal (e.g., gate) of a respective one of the P-channel MOSFETs of the CCP 70 and to a second terminal (e.g., drain) of the other respective P-channel MOSFET of the CCP 70.

The sense amplifier 50 further includes a transistor 76 that is used to equalize the voltages of the gut nodes 72 and 74 based on an equalization signal (EQ) 78 to an equalization transistor (e.g., transistor 76). Specifically, the gut node 72 may be discharged/charged to a bit line precharge voltage (VBLP) when the EQ 78 is asserted. The ISO 60 controls coupling of the gut node 72 to and decoupling of the gut node 72 from the digit line 66 via the transistor 62. Similarly, the ISO 60 controls coupling of the gut node 74 to and decoupling of the gut node 74 from the digit line 68 via the transistor 64.

The sense amplifier 50 further includes n-channel MOSFETs (NMOS) transistors 80, 82, 84, and 86. The n-channel transistors 86 and 82 both receive a local bit line compensation enable signal (LBLCP) 88 at their respective gates. Another terminal (e.g., source) of the NMOS transistor 86 is coupled to the digit line 68 while another terminal (e.g., source) of the NMOS transistor 82 is coupled to the digit line 66. The third terminal of the NMOS transistor 86 is coupled to a terminal (e.g., source) of the NMOS transistor 80, and the third terminal of the NMOS transistor 82 is coupled to a terminal (e.g., source) of the NMOS transistor 84. The gate of the NMOS transistor 80 is coupled to the digit line 68, and the gate of the NMOS transistor 84 is coupled to the digit line 66. The third terminals of the transistors 80 and 84 are coupled to an n-channel strobe (NCS) 90. The sense amplifier 50 receives an n-channel sense amplifier signal (NSA1) 92 to control a transistor 94 that selectively couples and decouples the NCS 90 from ground.

The illustrated embodiment of the sense amplifier 50 senses low voltage data and amplifies the low voltage data, but the sense amplifier 50 may have some drawbacks. Specifically, the local generation of the PCS (ACT) 58 from the VARY 52 may be problematic. Although VARY 52 may be a well-regulated voltage, there may be a voltage drop through the transistor 54 (and any other circuitry) during low voltage operation that may cause the PCS (ACT) 58 to improperly fluctuate. For example, VARY 52 may be regulated from VDD and may be as low as 0.8V for LPDRAM during an Activate cycle. This low voltage may correspond to a voltage drop through transistor 54 that could be as high as 0.1V, resulting in the PCS (ACT) 58 level being as low as 0.7V that may greatly degrade the activate cycle operation. By removing the local generation of the PCS (ACT) 58, such voltage drops during low voltage operation may be avoided. Furthermore, the limited amount of amplification in the sense amplifier 50 causes the length of the digit lines 66 and 68 to be limited and/or the amount of noise relatively significant.

Figure 3:
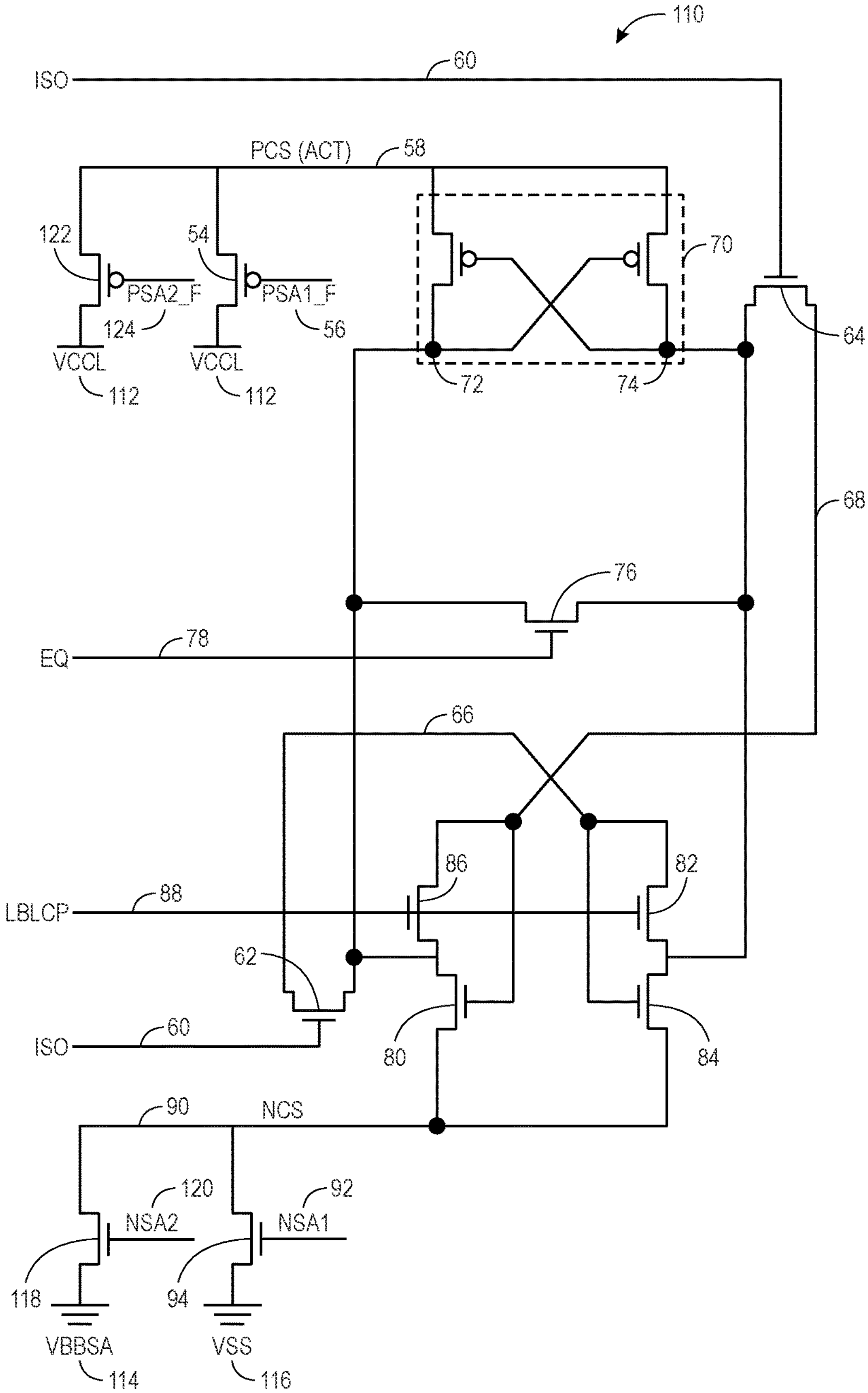
FIG. 3 is a circuit diagram of a second example sense amplifier of the sense amplifiers of FIG. 1 that uses n-channel compensation, according to an embodiment of the present disclosure.

To address the issues with the sense amplifier 50, an alternative embodiment of the sense amplifiers 14 may be used. For instance, FIG. 3 shows a sense amplifier 110 that may be used in place of at least one of the sense amplifiers 50 as the sense amplifiers 14 of FIG. 1. Circuitry is similar between FIGS. 2 and 3 and thus previous descriptions are relied on herein.

To exemplify the differences, the sense amplifier 50 may use a low voltage (VSS) or ground voltage of approximately 0 volts (V) (e.g., within a 2% tolerance, within a 1% tolerance, any suitable tolerance), a mid-voltage level of approximately 0.5 volts (V) (e.g., within a 2% tolerance, within a 1% tolerance, any suitable tolerance), and a high voltage (VARY) level of approximately 1.0 volts (V) (e.g., within a 2% tolerance, within a 1% tolerance, any suitable tolerance). The sense amplifier 110 is similar to the sense amplifier 50 except that the sense amplifier 110 is configured differently in that it does not connect the gut node 72 to VBLP via the transistor 76. The sense amplifier 110 continues to locally generate the PCS (ACT) 58 but does so based on a voltage (VCCL) 112 as opposed to the VARY 52. Moreover, the sense amplifier 110 includes an additional low voltage (VBBSA) 114 coupled to the transistor 118. The VBBSA 114 may be a negative voltage (e.g., negative voltage source). However, in certain systems, the VBBSA 114 may be an internally generated voltage used when a corresponding sensing amplifier row is enabled to allow sensing to occur. Thus, the VBBSA 114 may sometimes be reserved for use by transistors in the sense amplifier 110, as opposed to being a global negative voltage. The sense amplifier 110 also includes a transistor 122 that receives a control signal, PSA2_F 124. These changes enable the sense amplifier 110 to use a relatively lower voltage as a low reference voltage (e.g., VBBSA 114) of approximately −0.2V (e.g., within a 2% tolerance, within a 1% tolerance, any suitable tolerance), a mid-voltage level of approximately 0.5 volts (V) (e.g., within a 2% tolerance, within a 1% tolerance, any suitable tolerance), and a high voltage (VARY) level of approximately 1.0 volts (V) (e.g., within a 2% tolerance, within a 1% tolerance, any suitable tolerance). By using a lower low reference voltage, the drive strength of the sense amplifier 110 may be desirably increased without increasing a footprint size.

Indeed, as opposed to using a single low reference voltage throughout a sensing operation, the sense amplifier 110 uses a first low reference voltage (VBBSA) 114 and a second low reference voltage (VSS) 116 during the sensing operation. The sense amplifier 110 may be coupled to the VBBSA 114 via transistor 118 in response to a control signal, NSA2 120. The VBBSA 114 may be a negative voltage and may enable the sense amplifier 110 to have a suitably large gain relative. The improved driving characteristics of the sensing amplifier 100 may allow continued use of the reduced sense amplifier size due to the sense amplifier 110 producing reliable sensing outputs.

Figure 4:
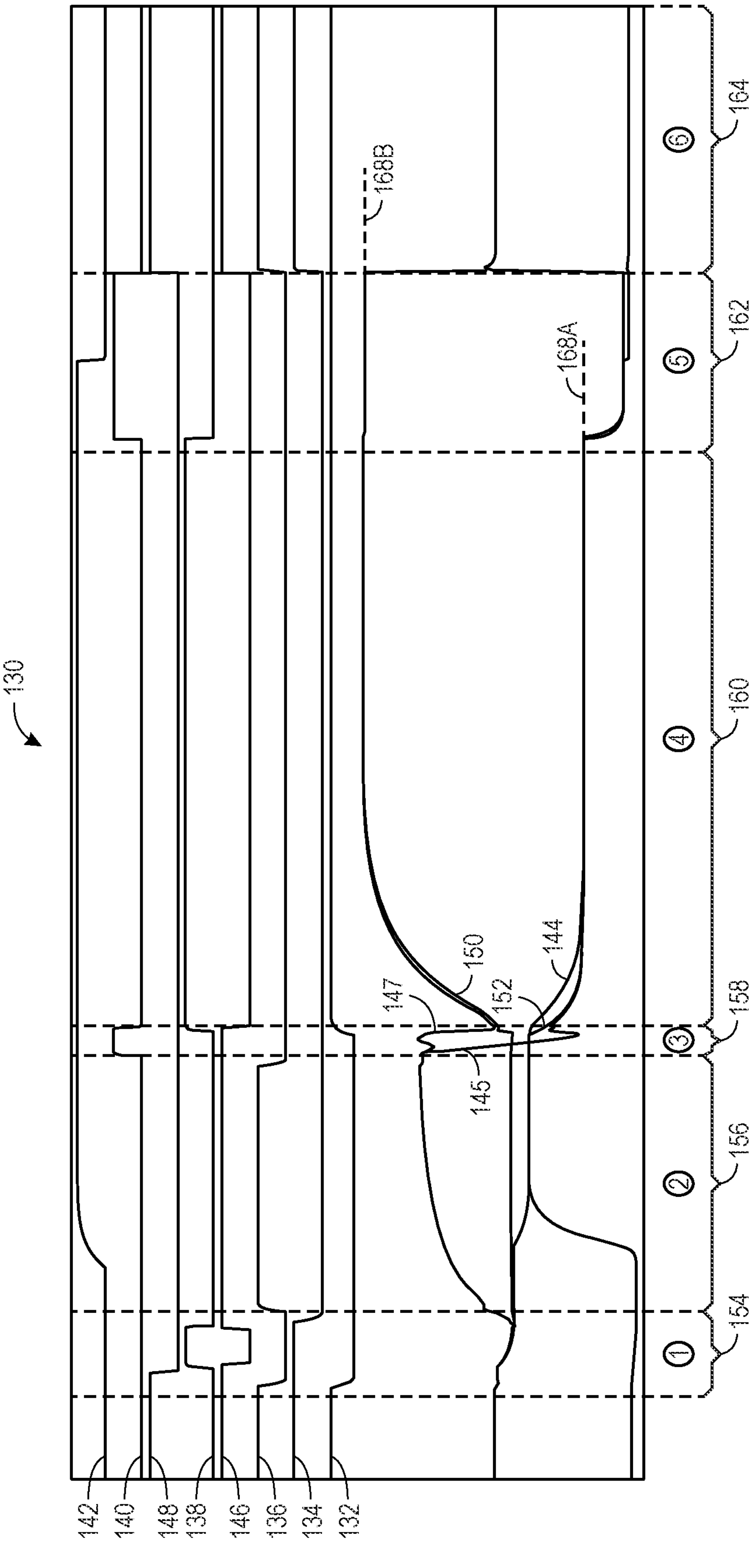
FIG. 4 is a timing diagram corresponding to the sense amplifier of FIG. 3, according to an embodiment of the present disclosure.

To help explain the operation of the sense amplifier 110 of FIG. 3, FIG. 4 is a timing diagram that illustrates signals associated with a sensing operation of the sensing amplifier 100 of FIG. 3 and FIGS. 5A-5G are circuit diagrams of the sensing amplifier 100 in the various operational stages associated with the sensing operation of FIG. 4. For ease of explanation, FIGS. 3, 4, and FIGS. 5A-5G may be referred to together herein. Described below is a sense amplifier system that may drive a cell voltage value during a precharge operation to a negative voltage level to force a greater drive strength to be used when sensing.

FIG. 4 is a graph 130 showing a timing diagram of the stages of operation of the sense amplifier 110 shown in FIGS. 3 and 5A-5G. As illustrated, the graph 130 includes lines 132, 134, 136, 138, 140, 142, 144, 145, 146, 147, 148, 150, and 152. The line 132 corresponds to the ISO 60. The line 134 corresponds to the LBLCP 88. The line 136 corresponds to the EQ 78. The line 138 corresponds to the NSA1 92, and the line 140 corresponds to the NSA2 120. The line 142 corresponds to the wordline corresponding to the sense amplifier 110. The line 144 corresponds to the high memory cell being read using the sense amplifier 110. The line 146 corresponds to the PSA1_F 56, and the line 148 corresponds to the PSA2_F 124. The line 150 corresponds to the digit line 66, and the line 152 corresponds to the digit line 68.

Figure 5A:
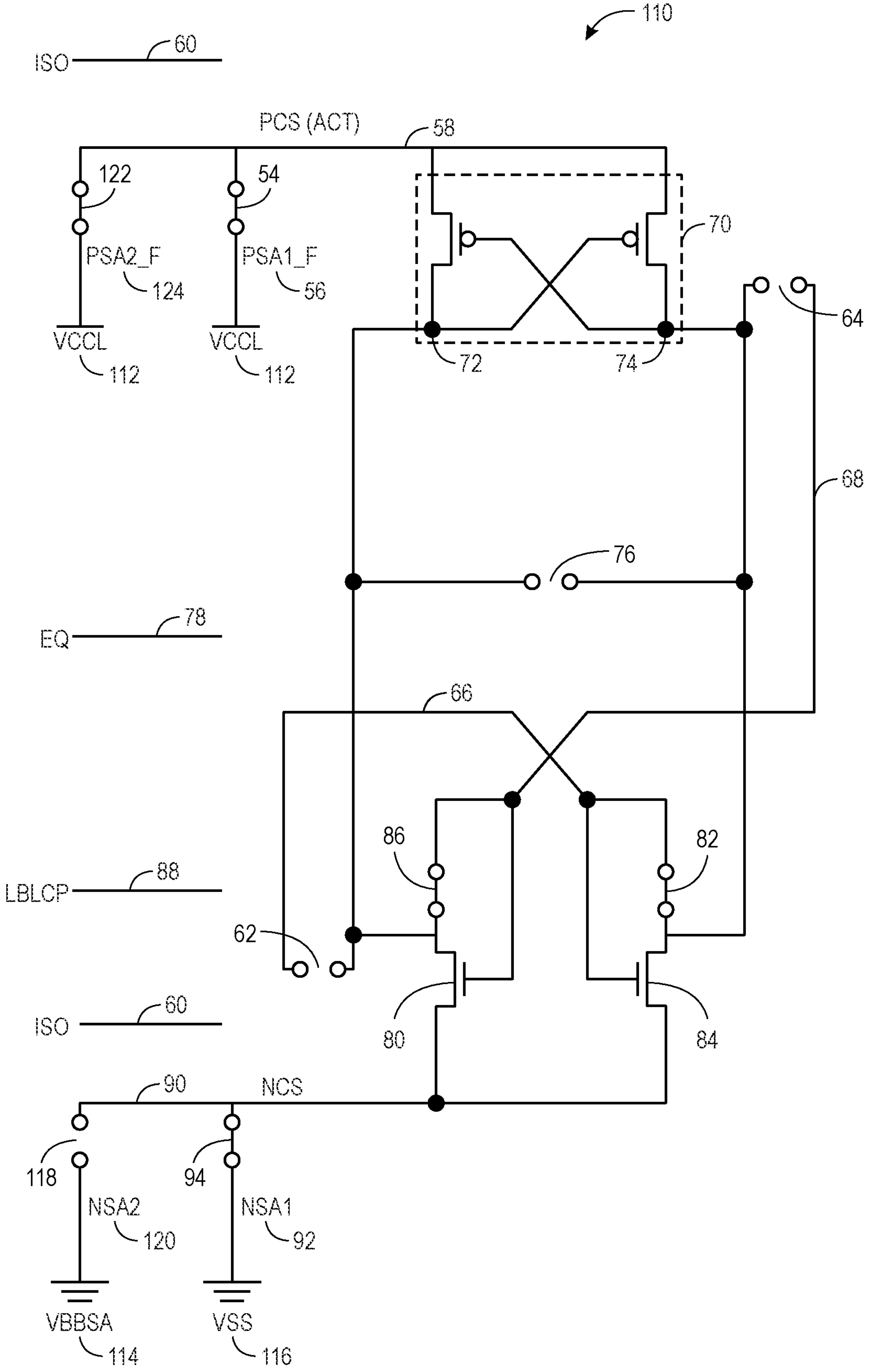
FIG. 5A is a circuit diagram of the example sense amplifier of FIG. 3 in a first stage of sense amplification, according to an embodiment of the present disclosure.

Referring now to FIG. 5A, FIG. 5A is a circuit diagram of the sense amplifier 110 in a first stage 154 corresponding to FIG. 4. This first stage 154 corresponds to a threshold voltage compensation (VtC) that may occur following a precharge operation of a previous cycle of the sense amplifier 110. As illustrated in FIG. 4, the wordline (line 142) and NSA2 120 (line 140) remain deasserted. The PSA2_F 124 (line 148), EQ 78 (line 136), LBLCP 88 (line 134), and ISO 60 (line 132) are each deasserted in the first stage 154. NSA1 92 (line 138) and PSA1_F 56 (line 148) are pulsed in the first stage 154.

This first stage 154 may correspond to a low-voltage threshold voltage (Vt) compensation stage with a gut node equalization. To elaborate, this stage begins with the LBLCP 88 being asserted along with the NSA1 92. During this stage, the ISO 60 is off/de-asserted thereby causing the transistor 64 to act as an open switch disconnecting the digit line 68 and the gut node 74. The off state of the ISO 60 also causes the transistor 62 to act as an open switch to disconnect the digit line 66 from the gut node 72. The EQ 78 is also deasserted at the beginning of the first stage 154 causing the transistor 76 to function as an open switch, which decouples the gut nodes 72 and 74 from each other. The LBLCP 88 and the NSA1 92 may be on/asserted for most of the time period of this first stage causing transistors 94, 86, and 82 to act as a closed switch and may be deasserted by the end of the first stage 154 (which is shown in FIG. 4 based on the changes in LBLCP 88 (line 134) and NSA1 92 (line 138)). The NSA2 120 may be off/deasserted causing the transistor 118 to act as an open switch for the duration of the first stage 154.

The assertion of LBLCP 88 causes the gut node 72 to be coupled to two terminals (e.g., gate and source) of the NMOS transistor 80. This connection is made because the LBLCP 88 being asserted causes the NMOS transistor 86 to act as a closed switch between the two terminals of the NMOS transistor 80. Similarly, the assertion of the LBLCP 88 causes the gut node 74 to be coupled to two terminals (e.g., gate and source) of the NMOS transistor 84. This connection is made because the assertion of the LBLCP 88 causes the NMOS transistor 80 to act as a closed switch between the two terminals of the NMOS transistor 84. Moreover, the connection of the third terminals (e.g., drain) of the NMOS transistors 80 and 84 is made to ground through the transistor 94 acting as a closed switch due to the assertion of the NSA1 92. Due to these connections, the transistors 80 and 84 act as diodes to enable threshold voltage compensation using the charge on the gut nodes 72 and 74 from the previous cycle to set the charge at the gut nodes 72 and 74 to the threshold voltages of the respective transistors 80 and 84.

Referring back to FIG. 4, as part of the transition between the first stage 154 and the second stage 156, the EQ 78 (line 136) is asserted and the LBLCP 88 (line 134) is deasserted. NSA2 120 (line 140), PSA2_F 124 (line 148), NSA1 92 (line 138), and ISO 60 (line 132) remain deasserted. PSA1_F 56 (line 146) and EQ 78 (line 136) remain asserted. The second stage 156 configuration causes the sense amplifier 110 to initiate signal development duration after WL turning on, which may result in the cell voltage (line 144) increasing gradually over a time period corresponding to the second stage 156.

Figure 5B:
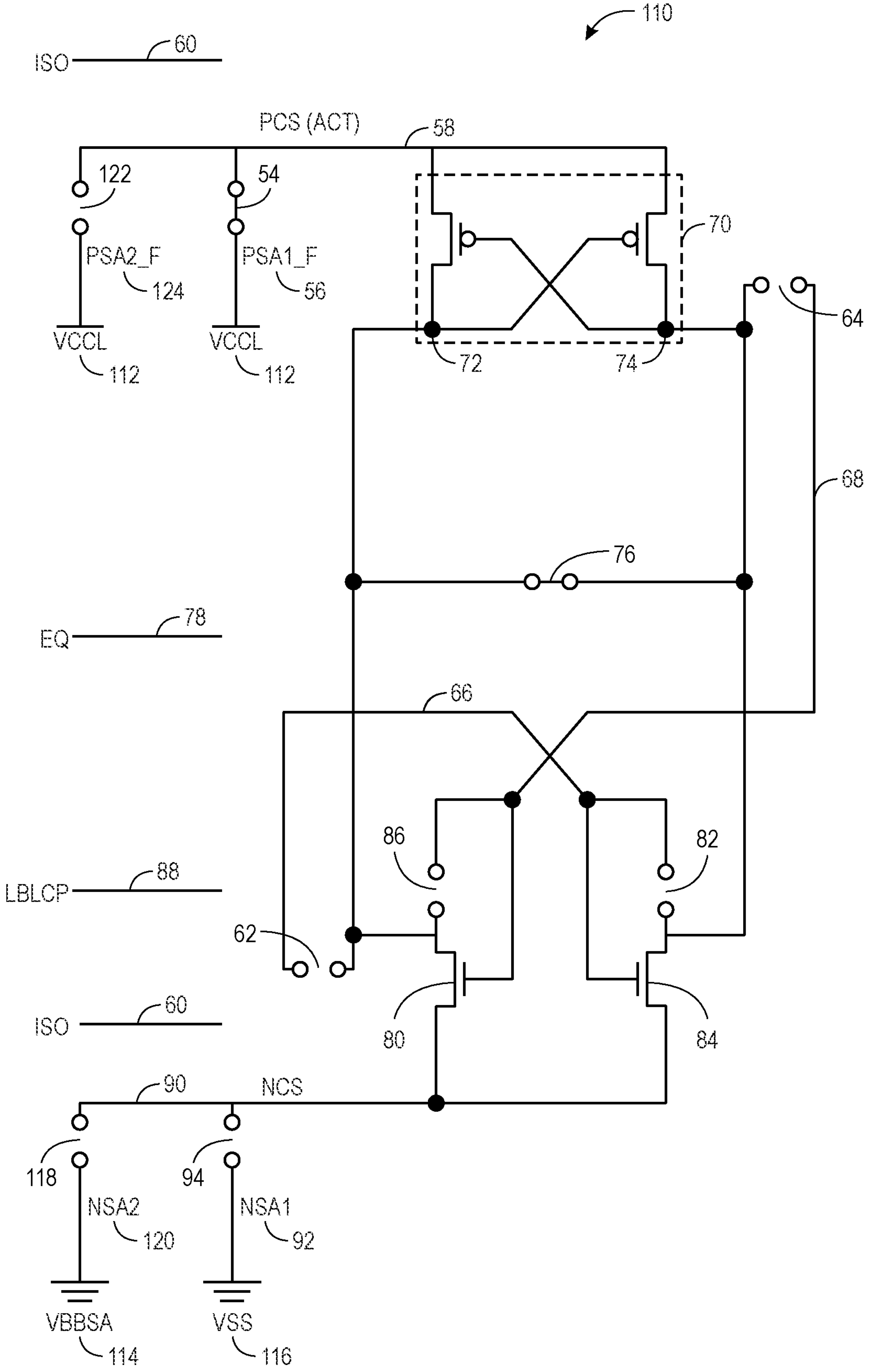
FIG. 5B is a circuit diagram of the example sense amplifier of FIG. 3 in a second stage of sense amplification, according to an embodiment of the present disclosure.

The second stage 156 of FIG. 4 corresponds to FIG. 5B. FIG. 5B is a circuit diagram of the sense amplifier 110 in a second stage 156 after the first stage 154 of FIG. 4. The second stage 156 may correspond to a signal development stage. This stage includes a deassertion of the LBLCP 88, NSA1 92, and NSA2 120 causing the transistors 86, 82, 94, and 118 to act as open switches. The memory cell (line 144) and the gut nodes 72 and 74 may be charged. Furthermore, since the EQ 78 is activated at the beginning of the second stage 156, the gut nodes 72 and 74 may be connected to cause charging to similar values that are higher than VBLP (e.g., as opposed to being charged to VBLP as is done in FIG. 2). Charging the gut nodes 72 and 74 to similar values (e.g., shorting the nodes to one node) may be beneficial for balancing 1's and 0's margin sensing during the subsequent stages. In some cases, the gut nodes 72 and 74 may be coupled to a relatively higher voltage than shown to further pull up the voltage values of the node and increase a gain of the sense amplifier 110.

Referring back to FIG. 4, in the third stage 158, the NSA2 120, the PSA1_F 56, and the wordline (e.g., line 142) are asserted while the NSA1 92, PSA2_F 124, the EQ 78, the LBLCP 88 and ISO 60 are deasserted. Indeed, during the third stage 158, the sense amplifier 110 may be operated in a differential amplifier configuration that causes charge on the gut node 74 (line 145) to be discharged to the low voltage level 168A while the charge on the gut node 72 (line 147) is amplified up to the high voltage level 168B. The pre-amplification of gut nodes 72 and 74 may increase the fidelity of interpretation of the data from the memory cells after ISO 60 is reasserted to proceed with the charge sharing process between gut nodes 72, 74 to digit lines 66 and 68.

Figure 5C:
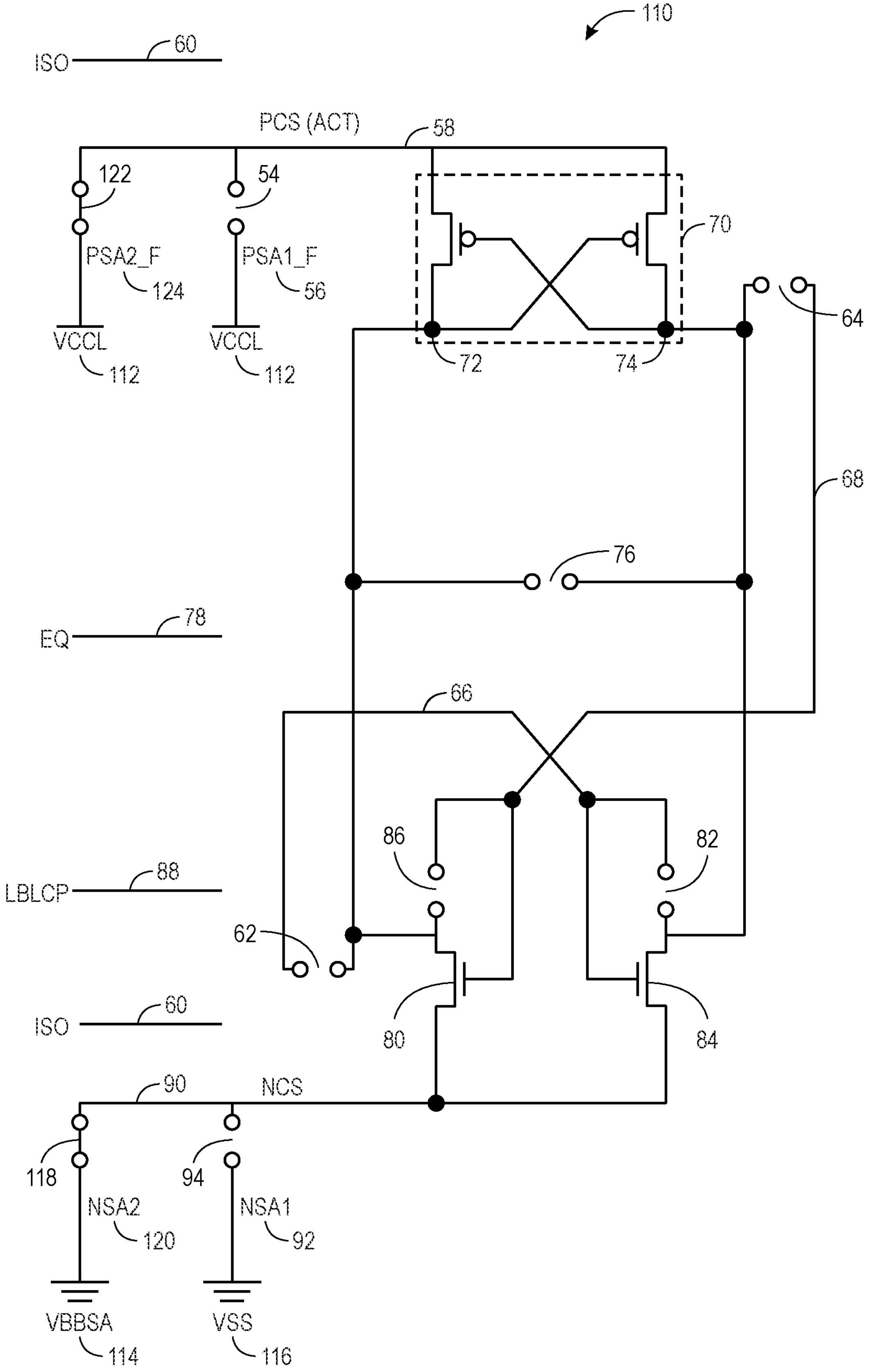
FIG. 5C is a circuit diagram of the example sense amplifier of FIG. 3 in a third stage of sense amplification, according to an embodiment of the present disclosure.

Referring now to FIG. 5C, FIG. 5C is a circuit diagram of the sense amplifier 110 operated in the third stage 158 after the second stage 156 of FIG. 4. The third stage 158 corresponds to a presense stage during which the sense amplifier 110 may operate in a differential voltage amplifier configuration. The EQ 78 is also deasserted during the third stage 158. The third stage 158 also corresponds to the NSA2 120 being asserted to cause the transistor 118 to act like a closed switch. When the NSA2 120 is asserted, the terminals (e.g., drains) of the transistors 80 and 84 are coupled to the VBBSA 114 voltage, which may be a relatively lower voltage than the VSS 116 voltage. Thus, the VBBSA 114 voltage (e.g., a negative source voltage) may be pulsed during the presense operation to keep a gate-source terminal voltage (Vgs) of the transistors 80 and 84 suitably above a threshold level. Due to the charge in the digit line 66, the NMOS transistor 84 discharges charge from the gut node 74 pulling the voltage of the gut node 74 down while the voltage of the gut node 72 is amplified by opening the transmission through the PMOS between the gut node 72 and the VARY 112. Thus, during the fourth stage 160, the difference in voltage between the gut nodes 72 and 74 is amplified. By increasing this voltage differential, there is a higher voltage delta between the digit lines 66 and 68 when the data is written to the digit lines 66 and 68 from the gut nodes 72 and 74 when the ISO 60 is reasserted, as shown in the fourth stage 160 shown in FIG. 5D.

Referring back to FIG. 4, in the fourth stage 160, the wordline (line 142) remains asserted while the NSA2 120 (line 140) and the PSA1_F 56 (line 146) are deasserted (to enter the fourth stage 160). The NSA1 92 (line 138) and the ISO 60 (line 132) are asserted. The PSA2_F 124 (line 148), the EQ 78 (line 136), and the LBLCP 88 (line 134) remain deasserted. This configuration causes the digit line 66 (line 150) to be charged from the high memory cell to voltage level 168B. This configuration also operates the sense amplifier 110 as a latch to latch in the values for the fourth stage 160.

Figure 5D:
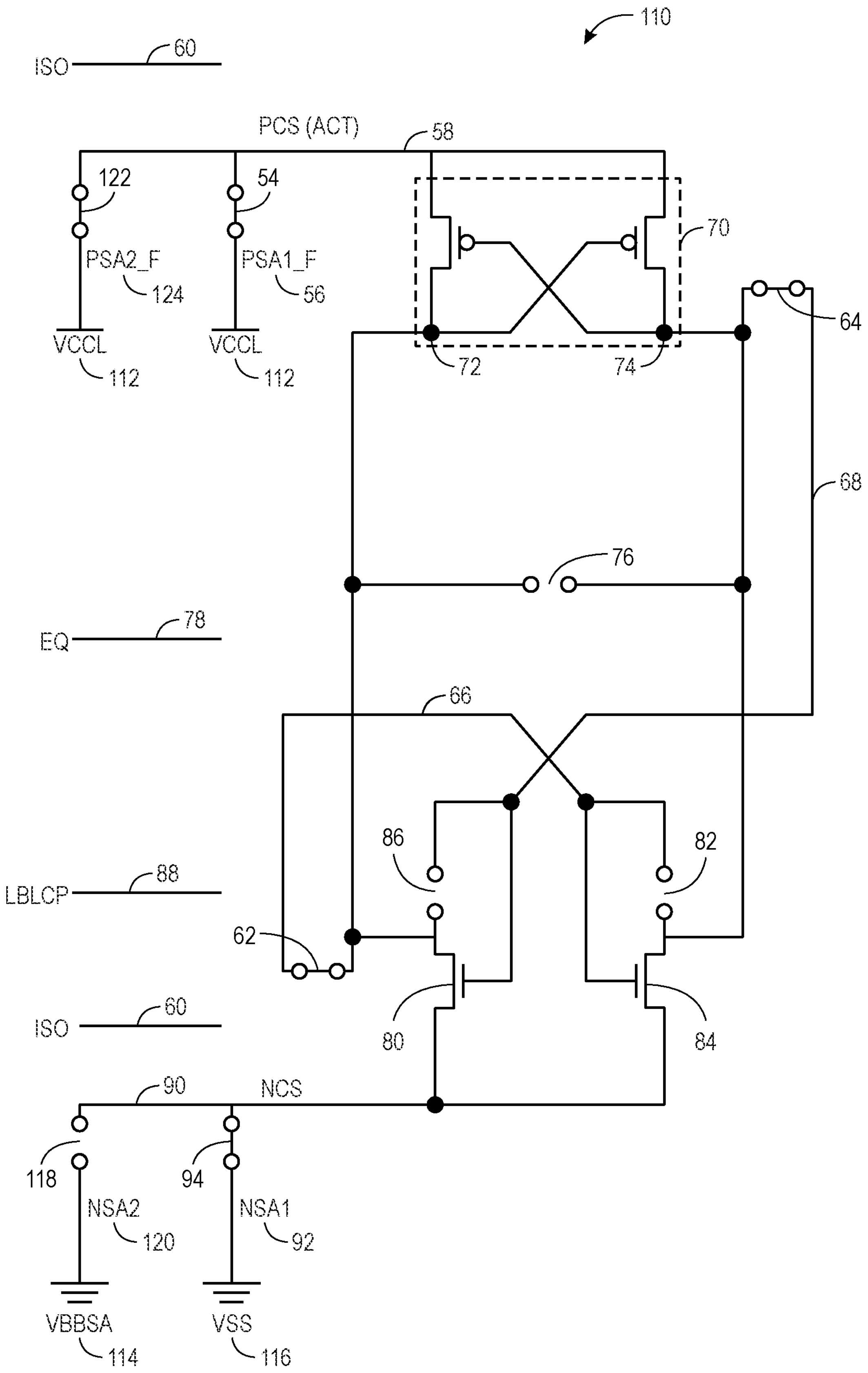
FIG. 5D is a circuit diagram of the example sense amplifier of FIG. 3 in a fourth stage of sense amplification, according to an embodiment of the present disclosure.

The fourth stage 160 corresponds to FIG. 5D, where FIG. 5D is a circuit diagram of the sense amplifier 110 while operated in the fourth stage 160. The fourth stage 160 may correspond to a latch stage used to write the data to the digit lines 66 and 68 from the gut nodes 72 and 74 when the ISO 60 is reasserted. In the latch stage, the PSA2_F 124 signal may remain asserted and PSA1_F 56 may be asserted to turn on transistors 54 and 122. EQ 78 and LBLCP 88 may remain deasserted, which keeps transistors 76, 86, and 82 turned off. ISO 60 and NSA1 92 may be asserted to turn on transistors 62, 64, and 94. NSA2 120 may be deasserted, turning off transistor 118.

Referring back to FIG. 4, in the fifth stage 162, the wordline (line 142) and NSA1 92 (line 138) are deasserted. NSA2 120 (line 140) is asserted and PSA2_F 124 (line 148), PSA1_F 56 (line 146), EQ 78 (line 136), and LBLCP 88 (line 134) remain deasserted. The ISO 60 (line 132) remains asserted. This configuration operates the sense amplifier 110 as a negative digit line write back during a precharge stage.

Figure 5E:
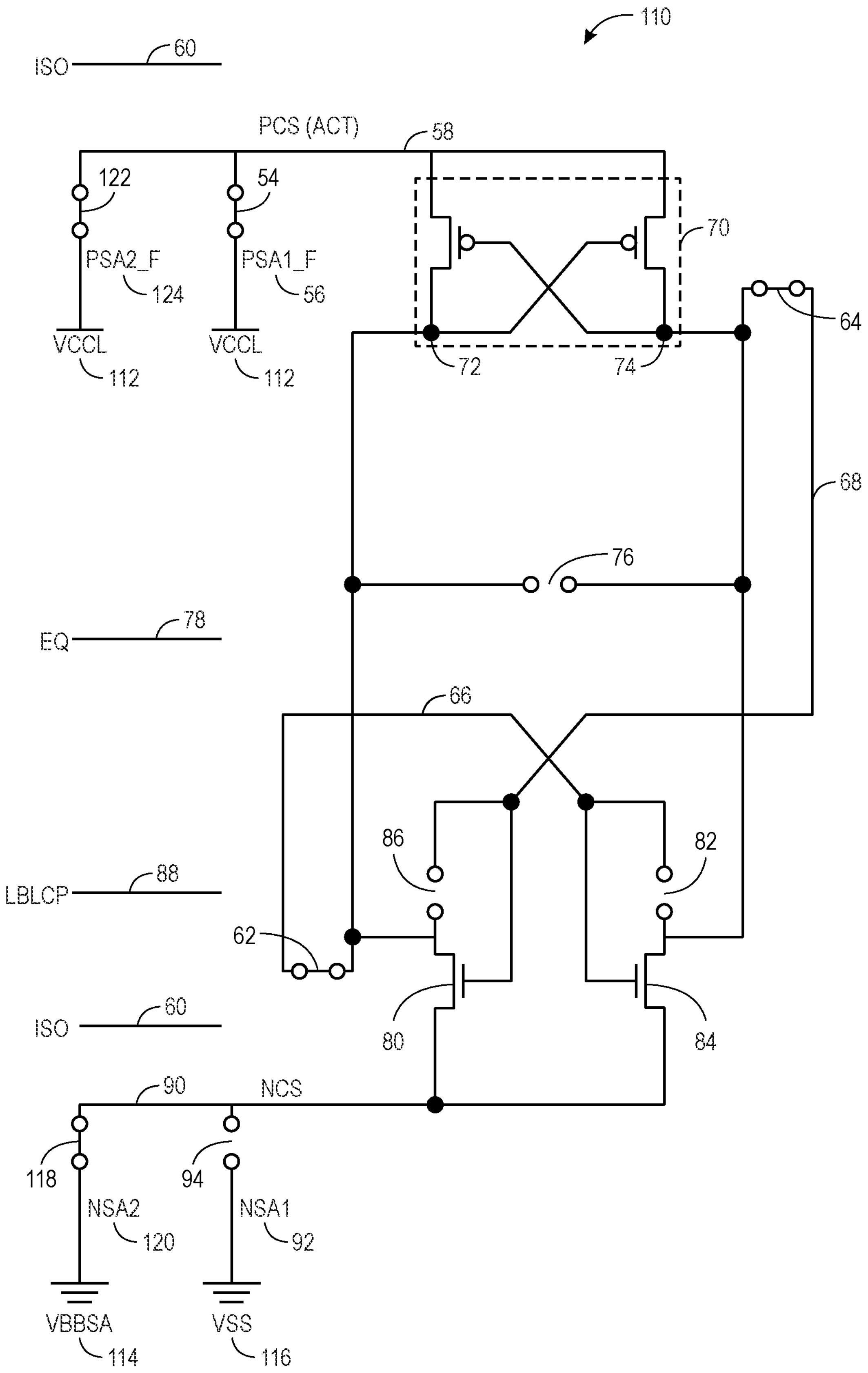
FIG. 5E is a circuit diagram of the example sense amplifier of FIG. 3 in a fifth stage of sense amplification, according to an embodiment of the present disclosure.

Referring now to FIG. 5E, FIG. 5E is a circuit diagram of the sense amplifier 110 in the fifth stage 162 after the fourth stage 160 of FIG. 4. The fifth stage 162 corresponds to a precharge stage during which negative digit line (DL) write back operations may occur. In the fifth stage 162, the NSA2 120 is asserted, turning on transistor 118, and the NSA1 92 is deasserted, turning off the transistor 94. The NSA2 120 asserting may cause NCS 90 to decrease in voltage corresponding to a pulling down the voltage based on the VBBSA 114 voltage. In other words, the NSA2 asserting may cause charging of the NCS 90 (e.g., to a negative voltage). This manifests as a change in memory cell voltage (line 144) of FIG. 4. ISO 60 may remain asserted to keep on the transistors 62 and 64. The PSA2_F 124 and PSA1_F 56 remain asserted to keep on transistors 54 and 122. EQ 78 and LBLCP 88 may remain deasserted, which keeps transistors 76, 86, and 82 turned off.

Figure 5F:
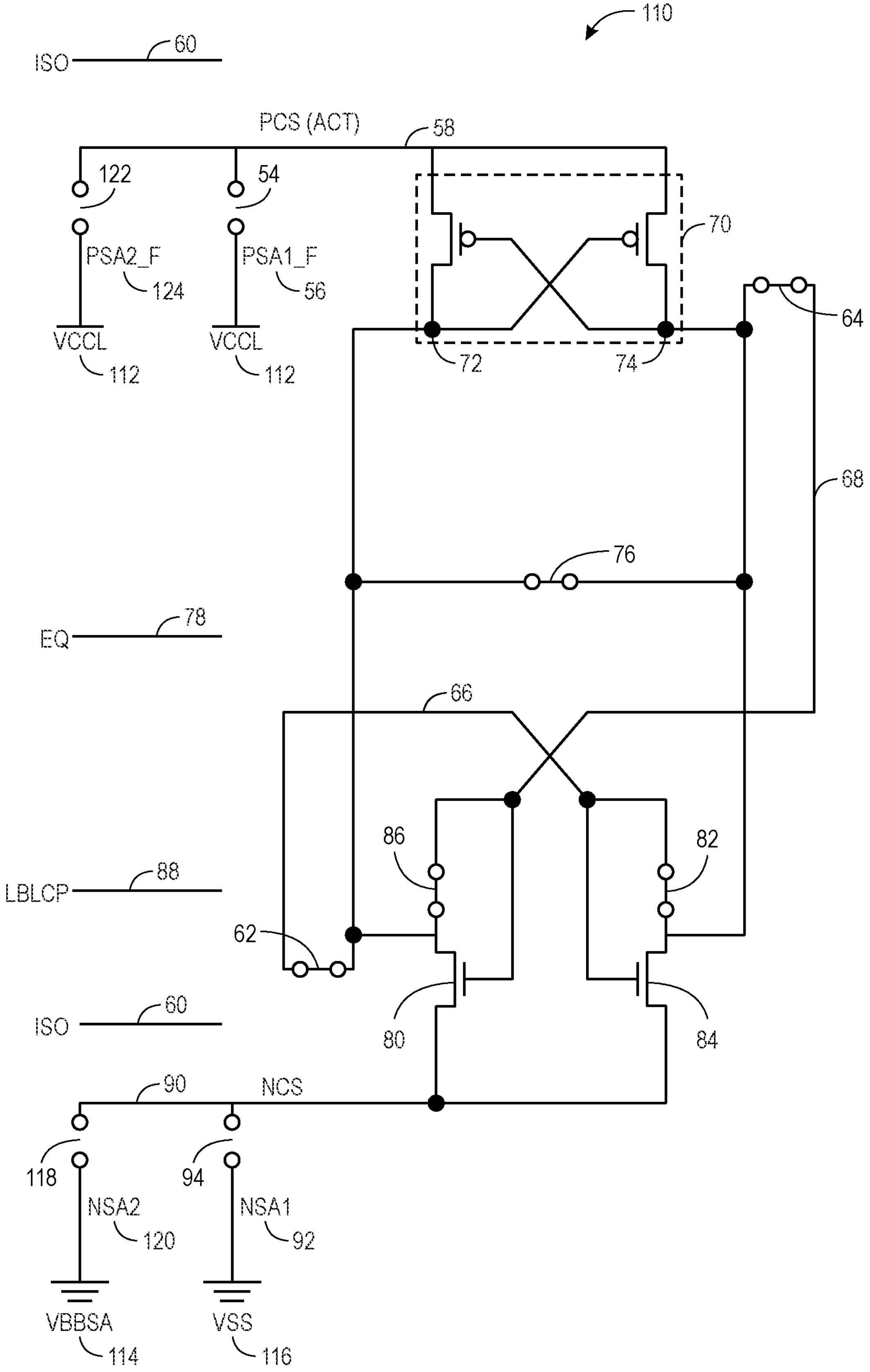
FIG. 5F is a circuit diagram of the example sense amplifier of FIG. 3 in a sixth stage of sense amplification, according to an embodiment of the present disclosure.

FIG. 5F is a circuit diagram of the sense amplifier 110 in a sixth stage 164 after the fifth stage 162 of FIG. 4. The sixth stage 164 corresponds to a DL equilibrium state of the sense amplifier 110 before a next sensing operation (e.g., before the operations repeat). At the end of the sensing operation shown by FIGS. 5A-5E, the sense amplifier 110 may be operated into the operational state shown in FIG. 5F. In the sixth stage 164, referring to FIG. 4, the NSA2 120 (line 140) and the NSA1 92 (line 138) are deasserted, turning off the transistors 94 and 118 of FIG. 5F. The PSA2_F 124 (line 148) and PSA1_F 56 (line 146) are deasserted to turn off transistors 54 and 122. ISO 60 (line 132) may remain asserted to keep on the transistors 62 and 64. EQ 78 (line 136) and LBLCP 88 (line 134) may be asserted, which may turn on transistors 76, 86, and 82.

Figure 6:
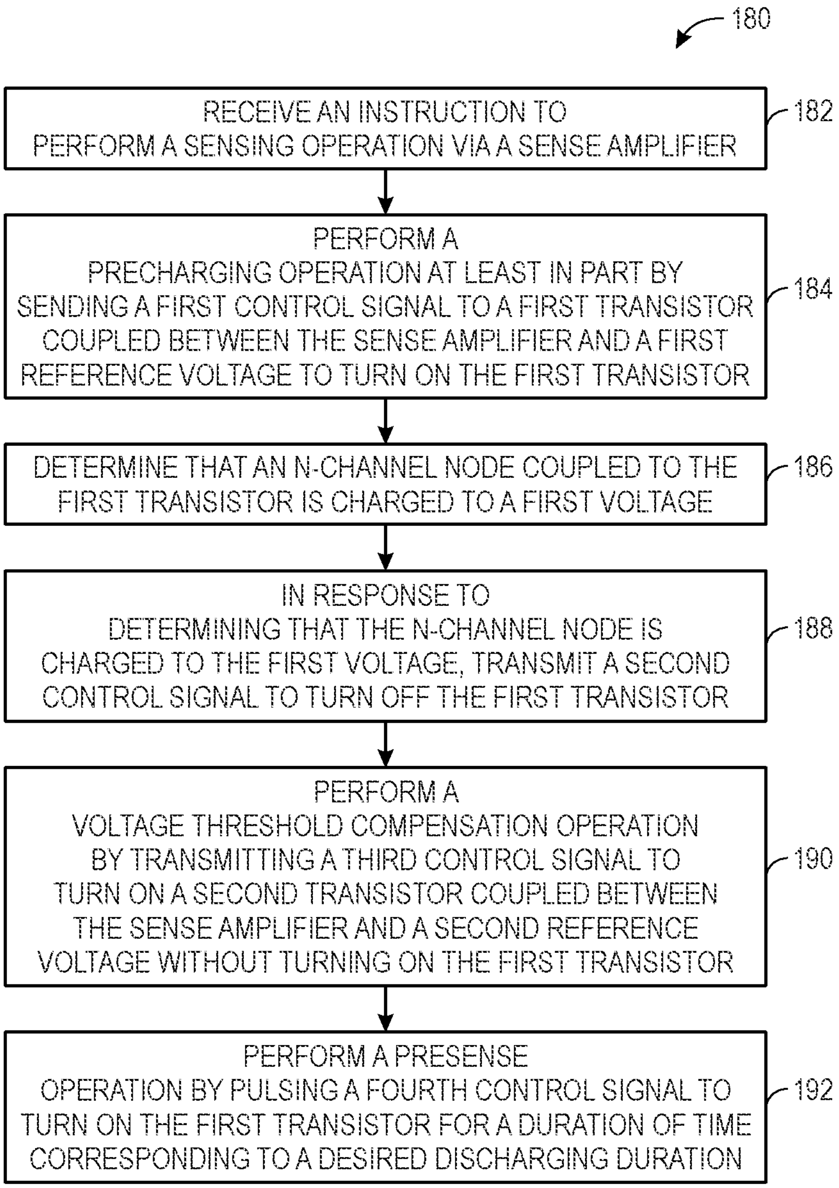
FIG. 6 is a flowchart of a method of operating the example sense amplifier of FIG. 3, according to an embodiment of the present disclosure.

FIG. 6 is a flow chart of a method 180 of operating the sense amplifier 110 associated with FIGS. 4-5F. As described herein, the method 180 is described as performed by a memory controller associated with the memory device 10. Although described in a particular order, which represents a particular embodiment, it should be noted that operations of the method 180 may be performed in any suitable order. Additionally, embodiments of the method 180 may omit process blocks and/or include additional process blocks. Moreover, in some cases the method 180 may be implemented at least in part by executing instructions stored in a tangible, non-transitory, computer-readable medium, such as memory associated with the memory controller, which may or may not be considered a part of the memory bank 12.

At block 182, the memory controller may receive an instruction to perform a sensing operation via a sense amplifier 110. The instruction may be generated by a host device communicatively coupled to the memory controller and/or the memory device. The instruction may correspond to a read operation associated with at least a portion of the memory bank 12.

At block 184, the memory controller may perform a precharge operation at least in part by sending NSA2 120 (e.g., a first control signal) to the transistor 118 (e.g., a first transistor) coupled between the sense amplifier 110 and VBBSA 114 (e.g., a first reference voltage) to turn on the transistor 118 (e.g., first transistor). The precharge operation may correspond to a precharging operation of a previous read operation (e.g., previous sense amplifier 110 operation). The VBBSA 114 may include a voltage level lower than VSS 116 (e.g., a second reference voltage). For example, VBBSA 114 may be a voltage between −0.25 volts (V) and −0.17V and/or a voltage less than 0V. As another example, VBBSA 114 may be a voltage between 1.1 volts (V) and 1.3V less than a high reference voltage of the sense amplifier 110.

At block 186, the memory controller may determine that an n-channel node (e.g., node 212 of FIG. 7, circuitry that transmits NCS 90) coupled to the transistor 118 is charged to a first voltage (e.g., charged down to the VBBSA 114 level). The memory controller, in some cases, may track an amount of time that has passed since charging began and later stop the charging at block 188 once a desired amount of time has passed that corresponds to charging to the first voltage. In response to determining that the n-channel node is charged to the first voltage, at block 188, the memory controller may transmit a second control signal (e.g., transmit a zero signal as the NSA2 120) to turn off the transistor 118. Operations of blocks 184 and 186 may correspond to operations of the fifth stage 162.

At block 190, the memory controller may perform a voltage threshold compensation operation by transmitting NSA1 92 (e.g., a third control signal) to turn on the transistor 94 (e.g., a second transistor) coupled between the sense amplifier 110 and VSS 116 (e.g., a second reference voltage without turning on the first transistor). Performing the voltage threshold compensation may involve the memory controller not sending a fourth control signal to turn on the transistor 118. Operations of block 190 may correspond to operations of the first stage 154 of FIG. 4.

At block 192, the memory controller may perform a presense operation at least in part by pulsing a NSA2 120 (e.g., fourth control signal) to turn on the transistor 118 for a duration of time corresponding to a desired discharging of a gut node 72 coupled to digit line 68 associated with the sense amplifier 110. Operations of block 192 may correspond to the third stage 158 of FIG. 4. The presense operation may set up the circuitry of the sense amplifier 110 for subsequent operations, like latching operations, active idle operations, and eventually precharge operations (e.g., to initialize the sense amplifier 110 for a subsequent sensing operation) associated with sending a finally amplified differential voltage to digit lines 66 and 68, as a differential signal.

Figure 7:
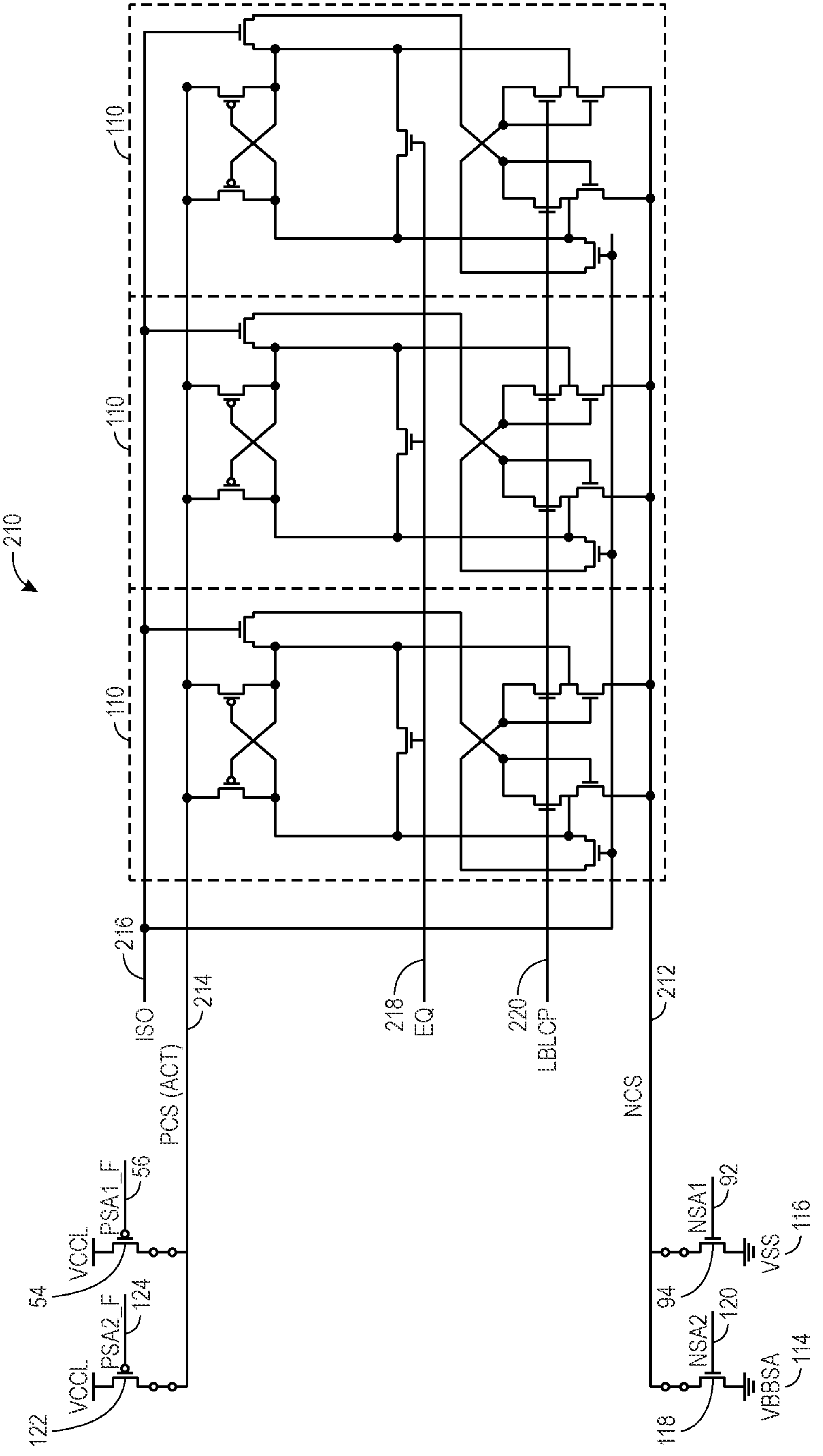
FIG. 7 is a circuit diagram of an example array of sense amplifiers of FIG. 3, according to an embodiment of the present disclosure.

FIG. 7 is a circuit diagram of an array section 210 that includes multiple sense amplifiers 110. In particular, the multiple sense amplifiers 110 may be coupled together via nodes 212, 214, 216, 218, and 220. The node 216 may transmit ISO 60 to the sense amplifiers 110 at a substantially similar or at least overlapping time. The node 218 may transmit EQ 78 to the sense amplifiers 110 at a substantially similar or at least overlapping time. The node 220 may transmit LBLCP 88 to the sense amplifiers 110 at a substantially similar or at least overlapping time. Similarly, the node 212 may transmit the NCS 90 to the sense amplifiers 110 at a substantially similar or at least overlapping time. The node 214 may transmit the PCS (ACT) 58 to the sense amplifiers 110 at a substantially similar or at least overlapping time. Thus, the array section 210 may be delivered the negative voltage level (e.g., VBBSA 114) via the transistor 118 output to the node 212.

Technical effects caused by systems and methods of the present disclosure may include improving a differential voltage window at latch time of a sense amplifier. Indeed, relatively smaller memory cell capacitances, relatively high memory cell leakages, and an increased likelihood for increased noise budget in 3DDRAM technologies may reduce a sensing time window used by a sensing amplifier. By using n-channel centric threshold voltage compensation (VtC) operations, negative gut EQ presense operations may use digit noise budget to pre-amplify a gut node to improve a differential voltage window at the latch time of the sense amplifier. In addition, n-channel centric VtC operations with negative source presense may improve or alleviate n-channel amplifier drive degradation. These systems and methods may further improve threshold voltage (Vt) compensation percentages otherwise associated with relatively weak p-channel PCS (ACT) drive signal during the VtC compensation time. Additionally, negative digit line write back operations at the beginning of a precharge time may help to widen an operating voltage of a memory cell, which may help improve digit line differential signals with a relatively smaller cell capacitance.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device, comprising:

a plurality of memory cells configured to store data;

a plurality of digit lines each configured to carry data to and from a respective memory cell of the plurality of memory cells; and a plurality of sense amplifiers each selectively coupled to respective digit lines of the plurality of digit lines and comprising a first transistor of cross-coupled transistors, a second transistor of the cross-coupled transistors, a first gut node, and second gut node, wherein each sense amplifier is configured to operate based on coupling, during a presense operation and during a precharging operation, the first and second gut nodes to an adjustable negative voltage source characterized by a negative voltage less than a ground voltage and based on coupling, during at least a latching operation, the first and second gut nodes to the ground voltage.

2. The electronic device of claim 1, wherein each sense amplifier is configured to:

charge an n-channel strobe node with the adjustable negative voltage source, wherein a shared coupling between the plurality of sense amplifiers is configured to couple the n-channel strobe node to each respective sense amplifier of the plurality of sense amplifiers;

amplify a differential voltage between the first and second gut nodes at least in part by charging the first gut node and discharging the second gut node based on respective charges from the plurality of digit lines, wherein the respective charges from the plurality of digit lines are based on the charged n-channel strobe node; and send the amplified differential voltage to respective digit lines of the plurality of digit lines as a differential signal.

3. The electronic device of claim 2, comprising a memory controller configured to:

receive an instruction to perform a sensing operation via a sense amplifier of the plurality of sense amplifiers;

perform a precharging operation at least in part by sending a first control signal to a third transistor coupled between the sense amplifier and the adjustable negative voltage source to turn on the third transistor, wherein turning on the third transistor is configured to charge a n-channel strobe node;

send a second control signal to turn off the third transistor based on the n-channel strobe node being charged to the negative voltage; and perform a voltage threshold compensation before amplifying the differential voltage at least in part by transmitting a third control signal to turn on the second transistor coupled between the sense amplifier and a second reference voltage source characterized by the ground voltage.

4. The electronic device of claim 3, wherein the memory controller is configured to:

perform the presense operation after performing the voltage threshold compensation at least in part by pulsing a fourth control signal to turn on the first transistor; and perform the latching operation and an active idle operation after performing the presense operation and after turning off the first transistor.

5. The electronic device of claim 4, wherein the sense amplifier comprises a first digit line of the plurality of digit lines that corresponds to the first gut node and a second digit line of the plurality of digit lines corresponds to the second gut node, wherein the sense amplifier comprises an equalization transistor configured to equalize the first and second gut node before amplifying the differential voltage, and wherein the equalization transistor is off during the presense operation.

6. The electronic device of claim 1, wherein the plurality of digit lines comprise a plurality of complementary pairs of digit lines of the plurality of digit lines.

7. The electronic device of claim 6, wherein each digit line of each of the plurality of complementary pairs of digit lines is coupled to respective memory cells storing complementary data.

8. The electronic device of claim 1, wherein the adjustable negative voltage source is configured to increase a gain of each of the plurality of sense amplifiers.

9. A memory device, comprising:

one or more memory cells configured to store data;

a pair of digit lines coupled to the one or more memory cells; and a sense amplifier coupled to the pair of digit lines and comprising:

cross-coupled transistors coupled to a supply voltage;

a first gut node coupled to a first transistor of the cross-coupled transistors, wherein the first gut node corresponds to a first digit line of the pair of digit lines;

a second gut node coupled to a second transistor of the cross-coupled transistors, wherein the second gut node corresponds to a second digit line of the pair of digit lines;

a third transistor coupled to the first gut node, wherein a gate of the third transistor is coupled to the second digit line;

a fourth transistor coupled to the second gut node, wherein a gate of the fourth transistor is coupled to the first digit line;

a fifth transistor coupled to an adjustable negative voltage, wherein a drain of the fifth transistor is coupled to a source of the third and fourth transistors, wherein the fifth transistor is closed during a presense operation, is closed during a precharge operation, and is open during a latching operation; and a sixth transistor coupled to a ground voltage, wherein the sixth transistor is open during the presense operation and closed during the latching operation, and wherein the drain of the sixth transistor is coupled to the source of the third and fourth transistors, wherein the adjustable negative voltage is less than the ground voltage.

10. The memory device of claim 9, wherein the presense operation is configured to prepare the sense amplifier for subsequent operations comprising the latching operation and active idle operations.

11. The memory device of claim 10, wherein the presense operation is performed after a precharging operation and before the subsequent operations, and wherein the fifth transistor is closed during the precharging operation.

12. The memory device of claim 9, comprising:

a first isolating transistor coupled between the first digit line and the first gut node to selectively decouple the first digit line from the first gut node when amplifying a difference in voltages between the first and second gut nodes; and a second isolating transistor coupled between the second digit line and the second gut node to selectively decouple the second digit line from the second gut node when amplifying the difference in voltages between the first and second gut nodes.

13. The memory device of claim 9, wherein the first and second transistors comprise PMOS transistors.

14. The memory device of claim 9, wherein the adjustable negative voltage is characterized as a voltage between −0.25 volts (V) and −0.17V.

15. The memory device of claim 9, wherein the adjustable negative voltage is characterized as a voltage between 1.1 volts (V) and 1.3V lower than the supply voltage.

16. The memory device of claim 9, wherein the fourth transistor is configured to use a charge of the first digit line to discharge a voltage of the second gut node, wherein the first transistor is configured to use the discharged voltage of the second gut node to amplify the voltage of the first gut node to amplify a differential voltage between the first and second gut nodes, and wherein a gain used to amplify the differential voltage is based on a voltage difference between the adjustable negative voltage and the supply voltage.

17. A method comprising:

receiving an instruction to perform a sensing operation via a sense amplifier;

performing a precharging operation at least in part by sending a first control signal to a first transistor coupled between the sense amplifier and a first reference voltage to close the first transistor;

determining that an n-channel node coupled to the first transistor is charged to a first voltage;

in response to determining that the n-channel node is charged to the first voltage, transmitting a second control signal to turn off the first transistor;

performing a voltage threshold compensation associated with the sensing operation at least in part by transmitting a third control signal to close a second transistor coupled between the sense amplifier and a second reference voltage, wherein the first reference voltage comprises an adjustable negative voltage level lower than the second reference voltage; and performing a presense operation at least in part by pulsing a fourth control signal to close the first transistor for a duration of time, wherein the presense operation is configured to set up circuitry of the sense amplifier for a latching operation, and wherein during the latching operation the first transistor is open.

18. The method of claim 17, wherein performing the voltage threshold compensation comprises not sending a fourth control signal to close the first transistor.

19. The method of claim 17, wherein performing the precharging operation corresponds to an additional instruction received before the instructions, and wherein the duration of time corresponds to a desired discharging of a gut node coupled to a digit line associated with the sense amplifier.

20. The method of claim 17, wherein the first reference voltage is characterized as a voltage between −0.25 volts (V) and −0.17V.

* * * * *